United States Patent
Eilert (10) Patent No.: US 7,111,149 B2
(45) Date of Patent: Sep. 19, 2006

(54) METHOD AND APPARATUS FOR GENERATING A DEVICE ID FOR STACKED DEVICES

(75) Inventor: Sean S. Eilert, Penryn, CA (US)

(73) Assignee: Intel Corporation, Santa Clara, CA (US)

( * ) Notice: Subject to any disclaimer, the term of this patent is extended or adjusted under 35 U.S.C. 154(b) by 261 days.

(21) Appl. No.: 10/615,050

(22) Filed: Jul. 7, 2003

(65) Prior Publication Data

US 2005/0010725 A1    Jan. 13, 2005

(51) Int. Cl.
G06F 12/02 (2006.01)

(52) U.S. Cl. .................. 711/220; 711/219; 365/230.01

(58) Field of Classification Search ................ 711/132, 711/219, 218, 220; 365/230.01
See application file for complete search history.

(56) References Cited

U.S. PATENT DOCUMENTS

| | | | |
|---|---|---|---|
| 6,560,692 B1 * | 5/2003 | Kudo et al. .................... | 712/23 |
| 6,654,871 B1 * | 11/2003 | Aidan et al. ................. | 712/202 |
| 2002/0131303 A1 * | 9/2002 | Martines et al. ........ | 365/185.18 |
| 2004/0155298 A1 * | 8/2004 | Bhattacharyya ............. | 257/378 |

* cited by examiner

*Primary Examiner*—Hiep T. Nguyen
(74) *Attorney, Agent, or Firm*—Cyndi M. Wheeler (57) ABSTRACT

A method for generating a unique device ID for each addressable device in a stack of multiple addressable devices by encoding a device ID for one device in the stack and determining a device ID for each of the other devices based on the device ID of an adjacent device in the stack.

43 Claims, 8 Drawing Sheets

METHOD AND APPARATUS FOR GENERATING A DEVICE ID FOR STACKED DEVICES

BACKGROUND OF THE INVENTION

1. Field of the Invention

The present invention relates to the field of stacked semiconductor devices, and more specifically to generating a unique device identifier for addressing each stacked device.

2. Discussion of Related Art

Addressable devices typically require some way by which each device can be addressed independently from other devices residing on the same bus. Addressable devices used in conventionally bonded stacked configurations may provide this capability by assigning each device a unique device identifier (ID). The device ID may be configured in the assembly process by bonding several device ID bondpads to power (Vcc) or ground (Vss), thereby encoding a unique device ID.

Figure 1:
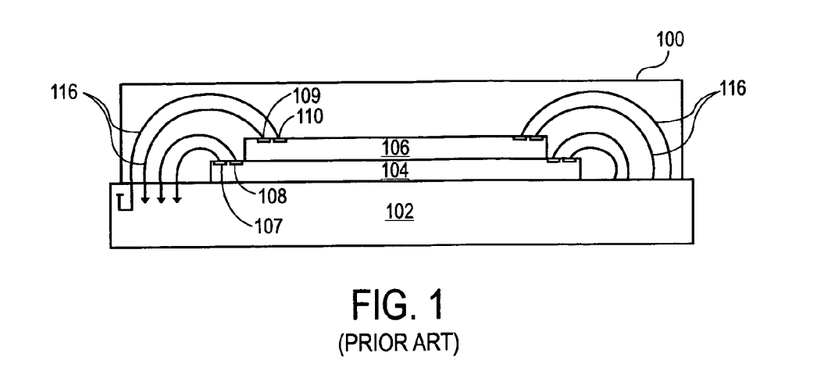
FIG. 1 is an illustration of a prior art method for bonding out a device ID.

FIG. 1 illustrates an exemplary approach of the current art for generating a device ID for a stacked memory device. FIG. 1 illustrates a cross-section of a package 100. The package 100 contains a package substrate 102 and two stacked memory devices 104 and 106 stacked on top of the package substrate. Memory devices 104 and 106 are bonded to substrate 102 by bond wires 116. The bond wires electrically connect the bondpads of each device to the package substrate 102. Device ID signal bond pads 107 and 108 are each connected to ground (Vss) in the package substrate. This generates a device ID of 00 for memory device 104. Device ID signal bond pad 109 is connected to ground (Vss) in the package substrate. Device ID signal bond pad 110 is connected to power (Vcc) in the package substrate. This generates a device ID of 01 for memory device 106. When two signals on each addressable device are used to generate a device ID using this conventional method, four unique device IDs can be generated, supporting four addressable devices on a bus.

Figure 2:
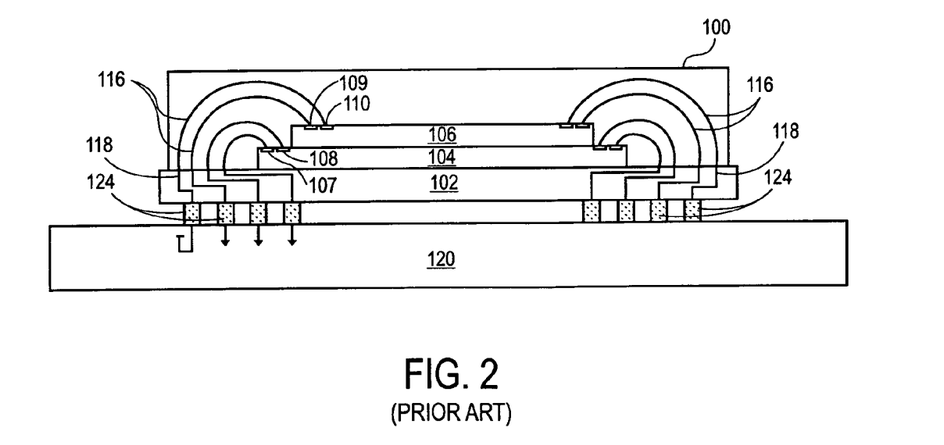
FIG. 2 is an illustration of a prior art method for bonding out a device ID.

Alternatively, the device ID of a device is encoded in the printed circuit board substrate, rather than in the package substrate, as shown in FIG. 2. FIG. 2 illustrates a cross-section of a package 100 on a printed circuit board 120. Package 100 contains a package substrate 102 and two stacked memory devices 104 and 106. Memory devices 104 and 106 are bonded to substrate 102 by bond wires 116. The bond wires electrically connect the bondpads of each device to the package substrate 102. Each device ID signal is routed from the bond wire 116 through the package substrate 102 as a conductive trace 118. The package 100 is connected to the printed circuit board through interconnects 124. Device ID signal bond pads 107 and 108 are each connected to ground (Vss) in the printed circuit board through the bond wires 116, conductive traces 118, and interconnects 124. This generates a device ID of 00 for memory device 104. Device ID signal bond pad 109 is connected to ground (Vss) in the printed circuit board through the bond wires 116, conductive traces 118, and electrical connections 124. Device ID signal bond pad 110 is connected to power (Vcc) in the printed circuit board through the bond wires 116, conductive traces 118, and electrical connections 124. This generates a device ID of 01 for memory device 106.

Future memory devices may utilize new technologies in packaging stacked devices, such as through-silicon vias or optical technology. The conventional method of bonding out a unique device ID for each stacked device, as described above, may not be practical for future device stacking technologies.

DETAILED DESCRIPTION OF THE PRESENT INVENTION

Embodiments of the present invention provide a method and apparatus for generating a unique device identifier (device ID) for each addressable integrated circuit (IC) device in a multi-die package, such as a stacked-CSP (chip scale package). Generation of a unique device ID for each stacked device is accomplished by including circuitry in each addressable device that generates a device ID based on an input device ID signal. The addressable device may then output the generated device ID to another device in the stack.

Figure 3:
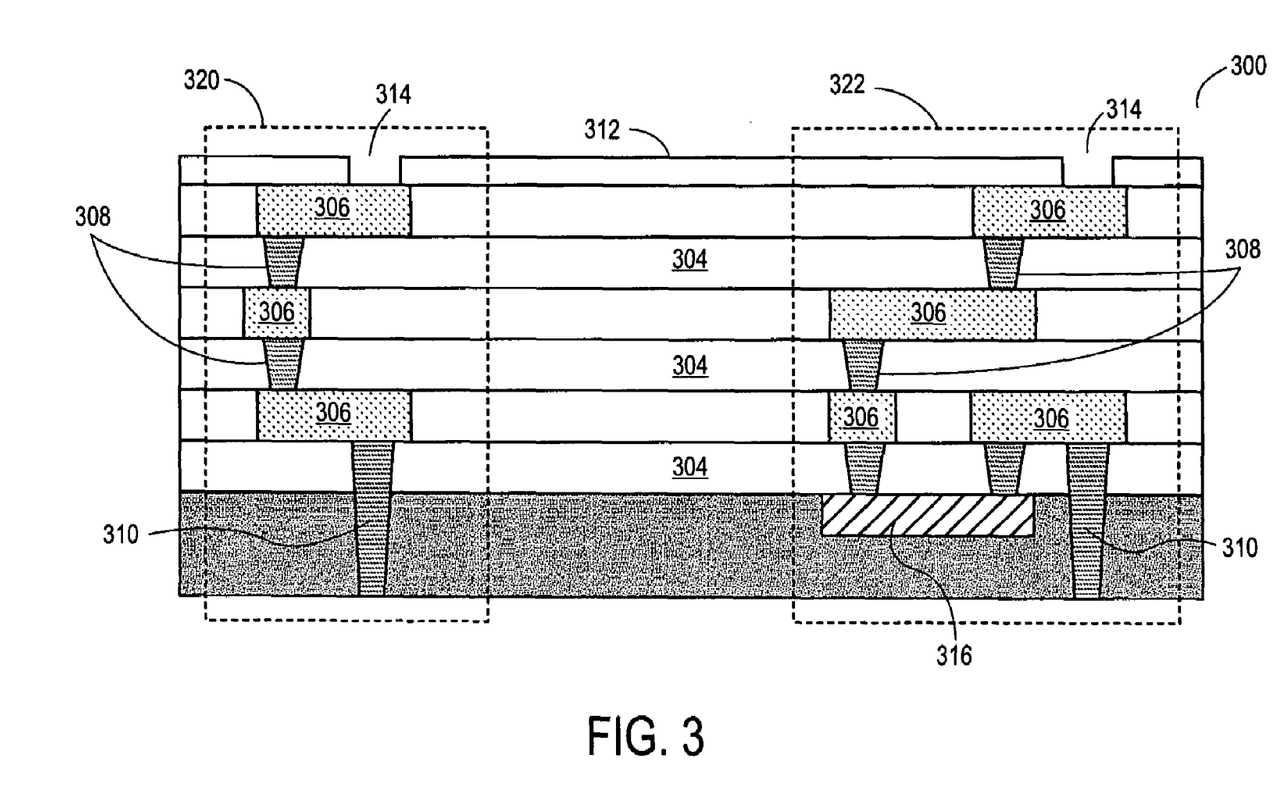
FIG. 3 is an illustration of a cross-section of a single die containing a device ID generating circuit according to one embodiment of the present invention.

FIG. 3 illustrates a cross section of a silicon device, or die, 300 according to one embodiment of the present invention. The die 300 includes a semiconductor substrate 302 located on the bottom of the die, interlayer dielectric (ILD) layers 304, metal layers 306, vias 308 and through-silicon vias 310. Note that while bottom and top are used here to describe relative locations as indicated by the figures, one skilled in the art will appreciate that in an actual implementation, orientations may be different than described herein. Substrate 302 is a semiconductor substrate having logic circuits, such as circuit 316, built into the substrate. The substrate may be formed of monocrystalline silicon, gallium arsenide, or another material commonly used in the art. The formation of circuits in the semiconductor substrate is commonly known in the art. The circuits formed within the substrate may include, but are not limited to such elements as transistors, resistors, and capacitors.

Vias 308 connect metal layers within the die, and are used to carry signals between metal layers. Through-silicon vias 310 are vias that extend through the substrate of the die. Through-silicon vias may be used to electrically connect one die to another die, and are used to carry electrical signals between two die. The process for creating a through-silicon via is well known in the art.

Passivation layer 312 is provided to protect the top surface of the die. Bondpad openings 314 in passivation layer 312 allow electrical connections to be made through the passivation layer to the underlying metal layers.

The region of the cross-section of the die indicated by box 320 is a general signal pass-through for signals such as address, data, and clock signals, or other signals on a bus. Power (Vcc) and ground (Vss) signals may also be passed through the die on a general signal pass-through. A single die may contain one or more general signal pass-through according to an embodiment of the present invention. A signal that is communicated through a general signal pass-through is passed vertically through the die, without being operated on. The signal may enter the die from the through-silicon via 310 at the bottom of the die and be passed through a series of vias 308 and metal layers 306 to the bondpad opening 314 at the top of the die. Alternately, the signal may enter the die from the bondpad opening 314 at the top of the die and be passed through a series of metal layers 306 and vias 308 to the through-silicon via 310 at the bottom of the die. In one embodiment of the present invention, one or more general signal pass-throughs may be used to pass a bus of signals vertically through the die from one surface of the die to another.

The region of the cross-section of the die indicated by box 322 is a signal pass-through for device ID signals. The signal pass-through for device ID signals includes a logic circuit 316 and has an input and an output. In one embodiment of the present invention, the logic circuit is a +1 adder circuit. In another embodiment of the present invention, the circuit contains combinatorial logic that produces a desired output from a given input. In other embodiments of the present invention, the circuit may be, but is not limited to, a +N adder circuit, a –N adder circuit, an active logical shifter, or a passive logical shifter. The output of the logic circuit is based on the signal input to the circuit, and is predetermined based on the design of the circuit.

The input device ID signal may include one or more bits. In one embodiment of the present invention, a single bit is used to indicate the device ID. In another embodiment of the present invention, two or more bits are used to indicate the device ID. The number of bits used to indicate the device ID (N) is dependent upon the number of addressable devices in the system. For example, if there are two addressable devices in the system, a single bit device ID is sufficient (N=1). If there are between two and four addressable devices in the system, a two-bit device ID is necessary (N=2). The number of addressable devices in the system must be less than or equal to $2^N$. For ease of illustration, a single signal is used to illustrate the device ID signal in FIG. 3 and all subsequent figures.

A first device ID signal of one or more bits is received at the logic circuit. The logic circuit 316 operates on the device ID signal and a second device ID signal is output from the circuit. In one embodiment of the present invention, the input to the logic circuit is a through-silicon via 310 and the output of the logic circuit is through a bondpad opening 314. In another embodiment of the present invention, the input to the logic circuit is through a bondpad opening 314 and the output of the logic circuit is a through-silicon via 310.

In one embodiment of the present invention, the die is an addressable device. In another embodiment of the present invention, the die is a memory device. The die may be, but is not limited to, flash memory, SRAM, DRAM, SDRAM, EPROM, EEPROM, or ROM. In yet another embodiment of the present invention, the die is a memory plus logic device. In yet another embodiment of the present invention, the die is a MEMS (Micro Electronic Mechanical System) device or MEMS memory device.

Figure 4:
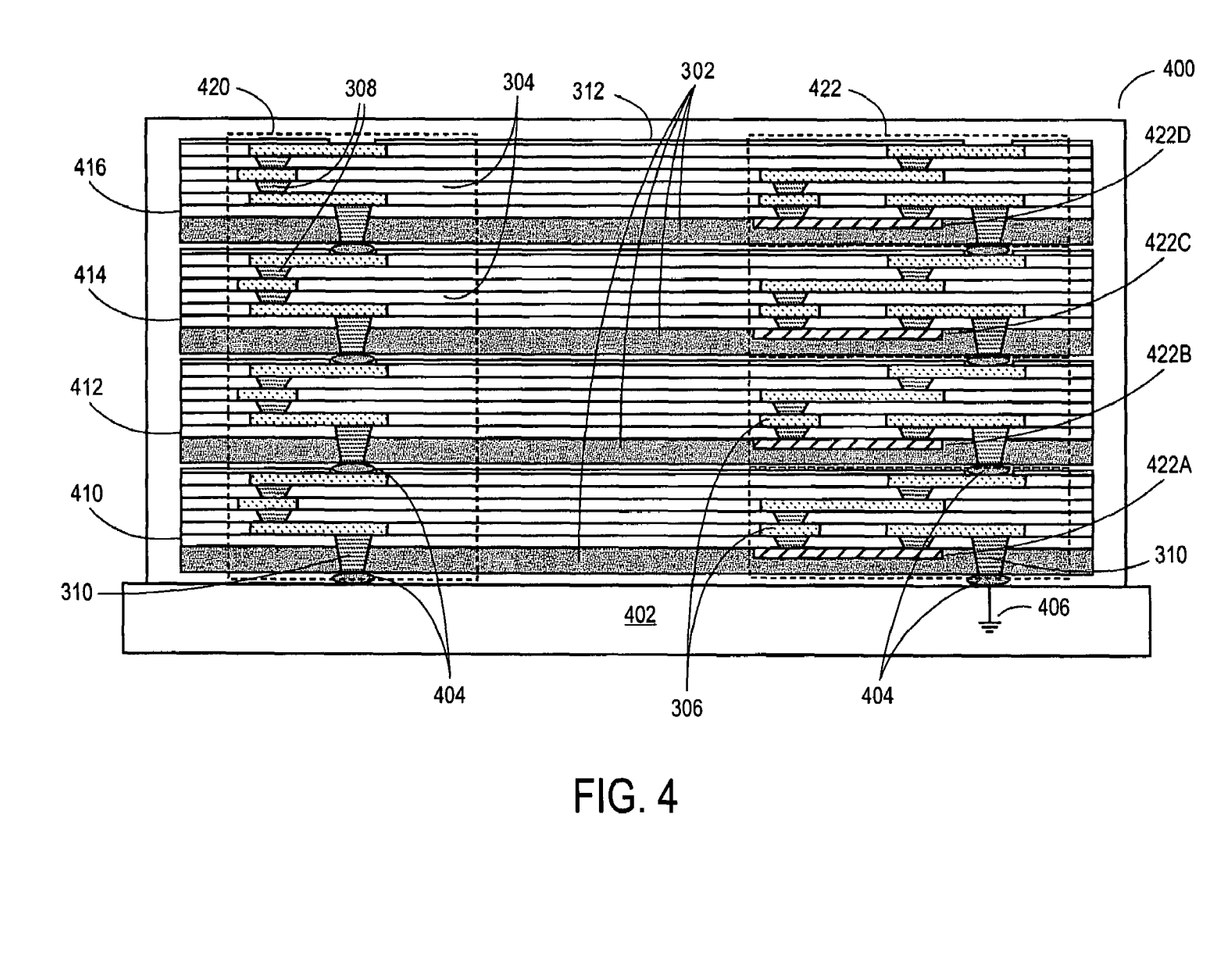
FIG. 4 is an illustration of a cross section of a package containing multiple stacked die, where the device ID of one of the stacked die is encoded in the package substrate and each die contains a device ID generating circuit, according to one embodiment of the present invention.

FIG. 4 illustrates a cross section of multiple die (410, 412, 414, 416) stacked in one package 400. Each of the die in the package contains at least one general signal pass-through 420 and a device ID pass-through logic circuit 422. The die are connected to each other by interconnects 404. The bottom die in the stack 410 is connected to the package substrate 402 by interconnect 404 as well. Interconnect 404 may be electrical, optical, or capacitive. The interconnect provides for signals to travel electrically, optically, or capacitively between the package substrate 404 and the lowest die in the stack 410, and allows signals to travel electrically, optically, or capacitively between adjacent die.

Each die in the stack contains a substrate 302, interlayer dielectric (ILD) layers 304, metal layers 306, vias 308, and through-silicon vias 310, as illustrated in FIG. 3 and described above.

Signals such as the address, data, and/or clock signals, as well as power and ground signals, are passed through the die stack on a general signal pass-through 420. Signals enter the die stack through the package substrate 402, and are passed vertically through die 410, die 412, die 414, and die 416.

The device ID signal is passed through the die stack on the device ID pass-through 422. In one embodiment of the present invention, the device ID for one device in the stack is encoded in the package substrate 402. In another embodiment of the present invention, the device ID for one device in the stack is configured electrically. In one embodiment of the present invention, electrical configuration of the device ID is done by programming of a number of non-volatile memory cells within the die. In another embodiment of the present invention, electrical configuration of the device ID is done using fuses. In yet another embodiment of the present invention, electrical configuration of the device ID is done using a unique mask for one die in the stack, where the device ID is hardwired using metal options.

As illustrated in FIG. 4, in one embodiment of the present invention, the device ID for the lowest device in the stack 410 is encoded to a value of zero by hard-wiring the device ID signal to ground (VSS) 406 in the package substrate 402. In another embodiment of the present invention, the device ID may be encoded to a non-zero value. In one embodiment of the present invention, the encoded device ID is read or sensed by another circuit in the device, and is used to indicate whether or not the lowest device in the stack, device 410, is the device being addressed by the address/data bus.

The encoded device ID is passed from the package substrate to the lowest device in the stack 410 through an interconnect 404. The device ID signal then passes through logic circuit 422A in die 410. Logic circuit 422A operates on the device ID signal, generating a second device ID value at the output of the logic circuit. The output of logic circuit 422A in die 410 is a different value than the value of the encoded device ID that was input to the circuit, and is determined based on the value that was input into the circuit. The output of logic circuit 422A is then passed through an interconnect 404 and input into logic circuit 422B in die 412.

The output of logic circuit 422A is the device ID for die 412. In one embodiment of the present invention, the device ID output from die 410 is passed to die 412, and then read or sensed by a circuit in device 412, and is used to indicate whether or not device 412 is the device being addressed by the address/data bus.

Similarly, logic circuit 422B operates on the device ID signal. The output of logic circuit 422B is a different value than the value that was input into logic circuit 422B, and is determined based on the value that was input into the circuit. The output of logic circuit 422B is then passed through an interconnect 404 and input into logic circuit 422C in die 414. The output of logic circuit 422B is the device ID for die 414. In one embodiment of the present invention, the device ID output from die 412 is passed to die 414, and then read or sensed by a circuit in device 414, and is used to indicate whether or not device 414 is the device being addressed by the address/data bus.

Finally, logic circuit 422C operates on the device ID signal. The output of logic circuit 422C is a different value than the value that was input into logic circuit 422C, and is determined based on the value that was input into the circuit. The output of logic circuit 422C is then passed through an interconnect 404 and input into die 416. The output of logic circuit 422C is the device ID for die 416. In one embodiment of the present invention, the device ID output from die 414 is passed to die 416, and then read or sensed by a circuit in device 416, and is used to indicate whether or not device 416 is the device being addressed by the address/data bus.

In one embodiment of the present invention, each of the logic circuits in each of the die is a +1 adder circuit. In another embodiment, one or more of the logic circuits may be a different type of logic circuit. In an embodiment where each of the logic circuits in each of the die is a +1 adder, the device ID of the first device in the stack, 410, is the value that is encoded in the package substrate, zero. The device ID signal is operated on by the +1 adder circuit in die 410, and a new device ID value is output from die 410 and input to the next device in the stack, die 412. The device ID for die 412 is 1 (0+1=1). Similarly, the modified device ID signal is operated on by the +1 adder circuit in die 412, and a new device ID value is output from die 412 and input to the next device in the stack, die 414. The device ID for die 414 is 2 (1+1=2). Finally, the twice modified device ID signal is operated on by the +1 adder circuit in die 414, and a new device ID value is output by die 414 and input to the last device in the stack, die 416. The device ID for die 416 is 3 (2+1=3). The +1 adder circuit in die 416 may also operate on the device ID signal, however, the output from die 416 is not passed to another die, so the device ID generated by the top device in the stack may not be used.

Figure 5:
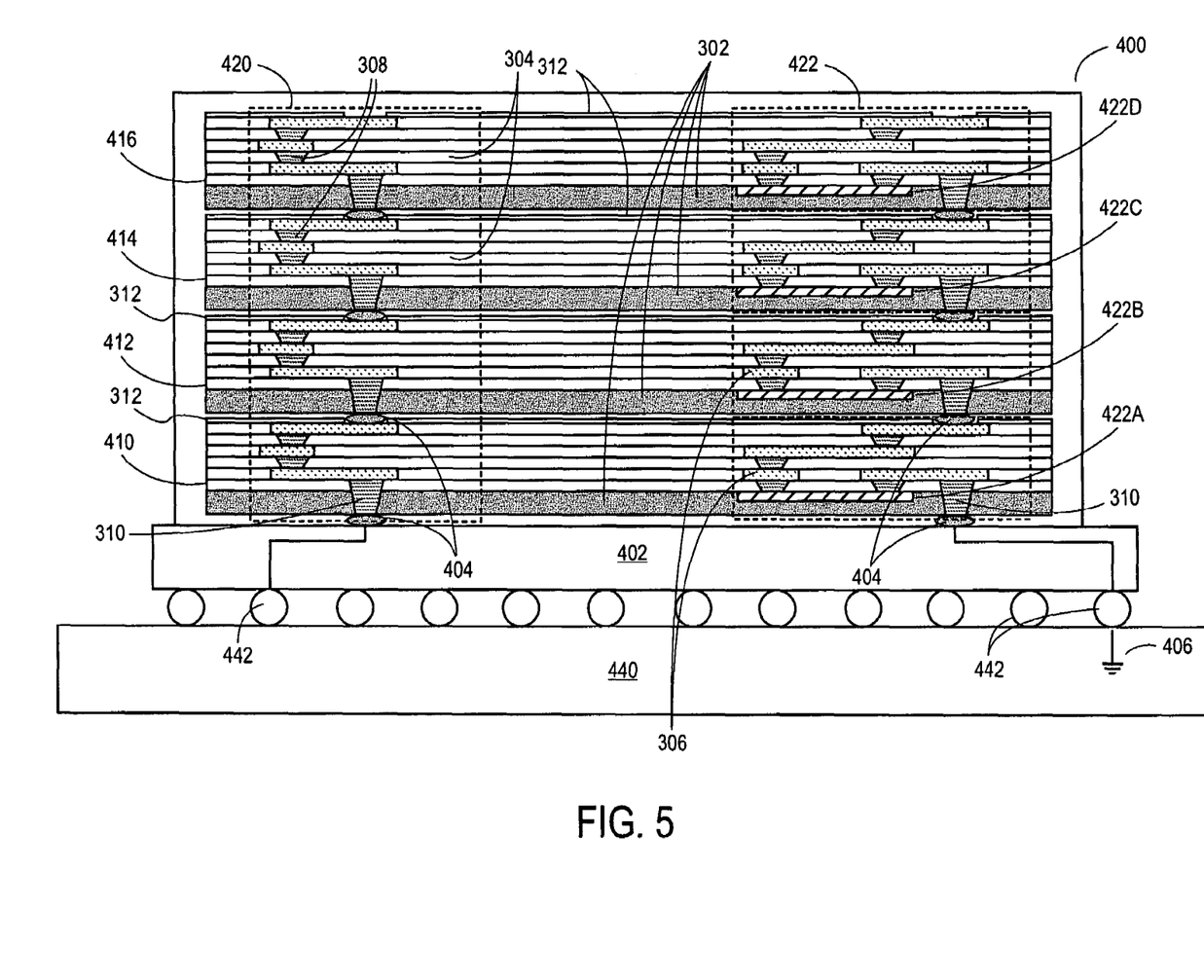
FIG. 5 is an illustration of a cross section of a package containing multiple stacked die, where the device ID of one of the stacked die is encoded in the printed circuit board and each die contains a device ID generating circuit, according to one embodiment of the present invention.

FIG. 5 illustrates a package 400 containing multiple stacked die (410, 412, 414, 416) on a printed circuit board 440. The package substrate 402 is coupled to the printed circuit board 440 electrically, optically, or capacitively by interconnects 442. In one embodiment of the present invention, the package substrate is connected to the printed circuit board electrically, with solder.

In another embodiment of the present invention, the bottom die in the stack is mounted directly on the printed circuit board and the die stack is not enclosed within a package having a package substrate. The bottom die in the stack may be directly coupled to the printed circuit board either electrically; optically, or capacitively. In yet another embodiment of the present invention, the die stack is not enclosed within a package having a package substrate and the top die in the stack is wire-bonded to the printed circuit board.

As illustrated in FIG. 5, each of the die in the package contains at least one general signal pass-through 420 and at least one device ID pass-through logic circuit 422, as described above. In one embodiment of the present invention, the device ID for the lowest device in the stack is encoded in the printed circuit board substrate 440, rather than in the package substrate. This configuration allows for the most flexibility in system design.

Signals such as the address, data, or clock signals, as well as power and ground signals, are passed through the die stack on the general signal pass-through 420. Signals enter the die stack from the printed circuit board through an interconnect 442, are routed through the package substrate 402 and interconnect 404, and are passed vertically through die 410, die 412, die 414, and die 416 through a series of vias, metal layers, and die interconnects.

The device ID for the lowest device in the package 410 is encoded in the printed circuit board. The encoded device ID enters the package from the printed circuit board through an interconnect 442, and is routed through the package substrate 402 and interconnect 404 to the lowest device in the stack 410. As illustrated in FIG. 5, in one embodiment of the present invention, the device ID for the lowest device in the stack is encoded to a value of zero by hard-wiring the device ID signal to ground (VSS) 406 in the printed circuit board substrate.

As the device ID signal passes vertically through the die stack, it is operated on by logic circuits 422A–D in each die as described above. In one embodiment of the present invention, the device ID for each subsequent die in the stack is determined based on the device ID of the device immediately below it in the stack. In another embodiment of the present invention, the device ID for each subsequent die in the stack is determined based on the device ID of a device immediately adjacent to it in the stack. Using this method, a unique device ID is generated for each die in the stack.

To use this method for generating a device ID, at least two die must be stacked together. This method does not place a limit on the number of die that may be stacked. Furthermore, the orientation of the die in the package is insignificant. In embodiments of this invention, the die may be stacked in top-bottom, bottom-bottom, or top-top configurations.

In a top-bottom stacking configuration, as illustrated in FIG. 5, the die are stacked so that the substrate 302 (bottom) of one die is closest to the top passivation layer 312 (top) of an adjacent die. Adjacent die are connected to one another by interconnects 404. The die nearest to the package substrate may be oriented as shown in FIG. 5, so that the substrate 302 (bottom) of the die is nearest to the package substrate 402 and is attached to the package substrate by interconnects 404.

Figure 6:
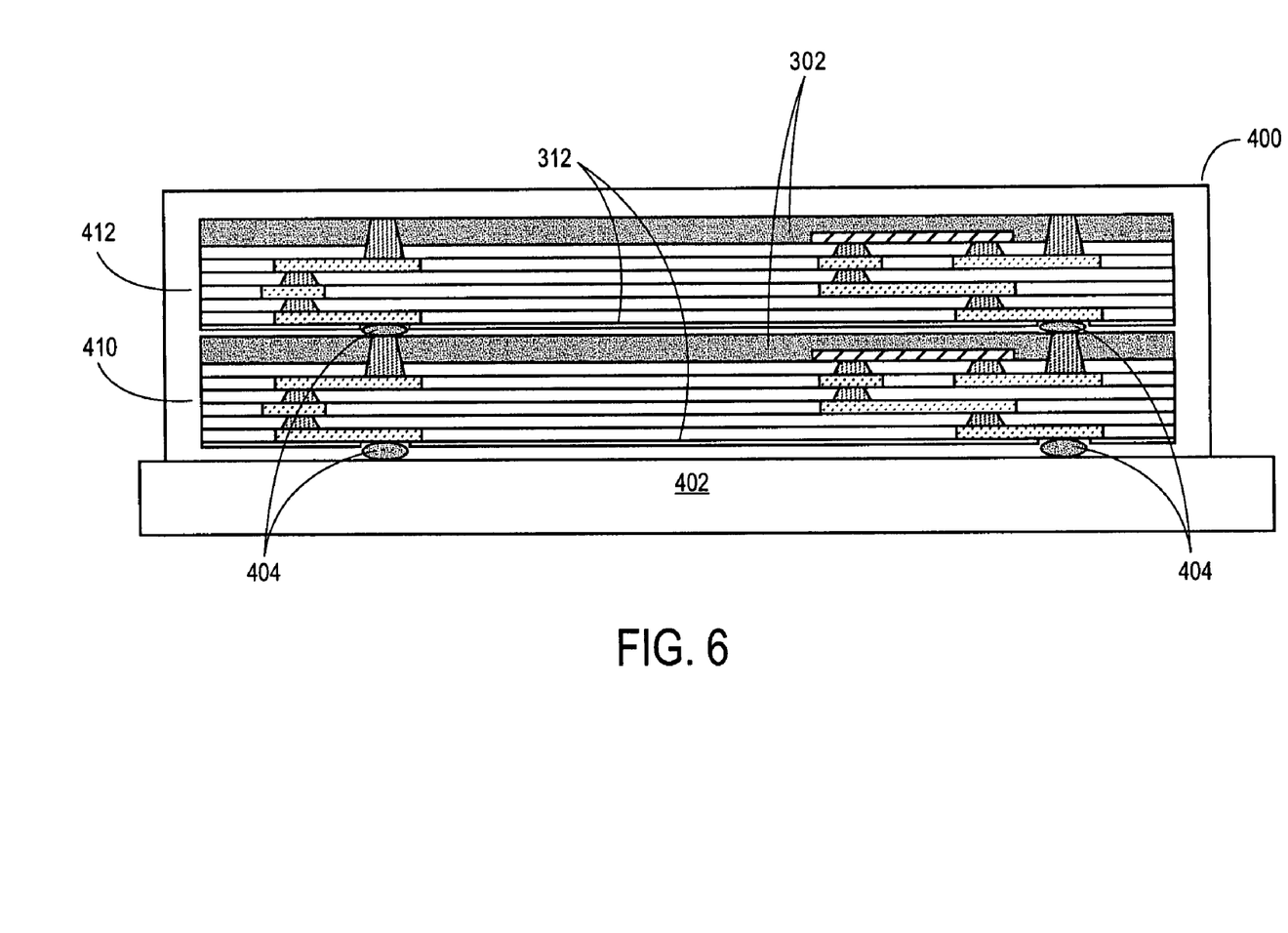
FIG. 6 is an illustration of a cross section of a package containing multiple stacked die according to one embodiment of the present invention, where the die are stacked so that the top passivation layer of the bottom die in the stack is nearest to the package substrate.

The package 400 of FIG. 6 illustrates another embodiment of the present invention. The die adjacent to the package substrate in a top-bottom stacking configuration may be oriented so that the passivation layer 312 (top) of die 410 is nearest to the package substrate 402 and is attached to the package substrate by interconnects 404. Die 412 is coupled to die 410 by interconnects 404, and is oriented so that the top passivation layer 312 of die 412 is adjacent to the substrate 302 of die 410.

Figure 7:
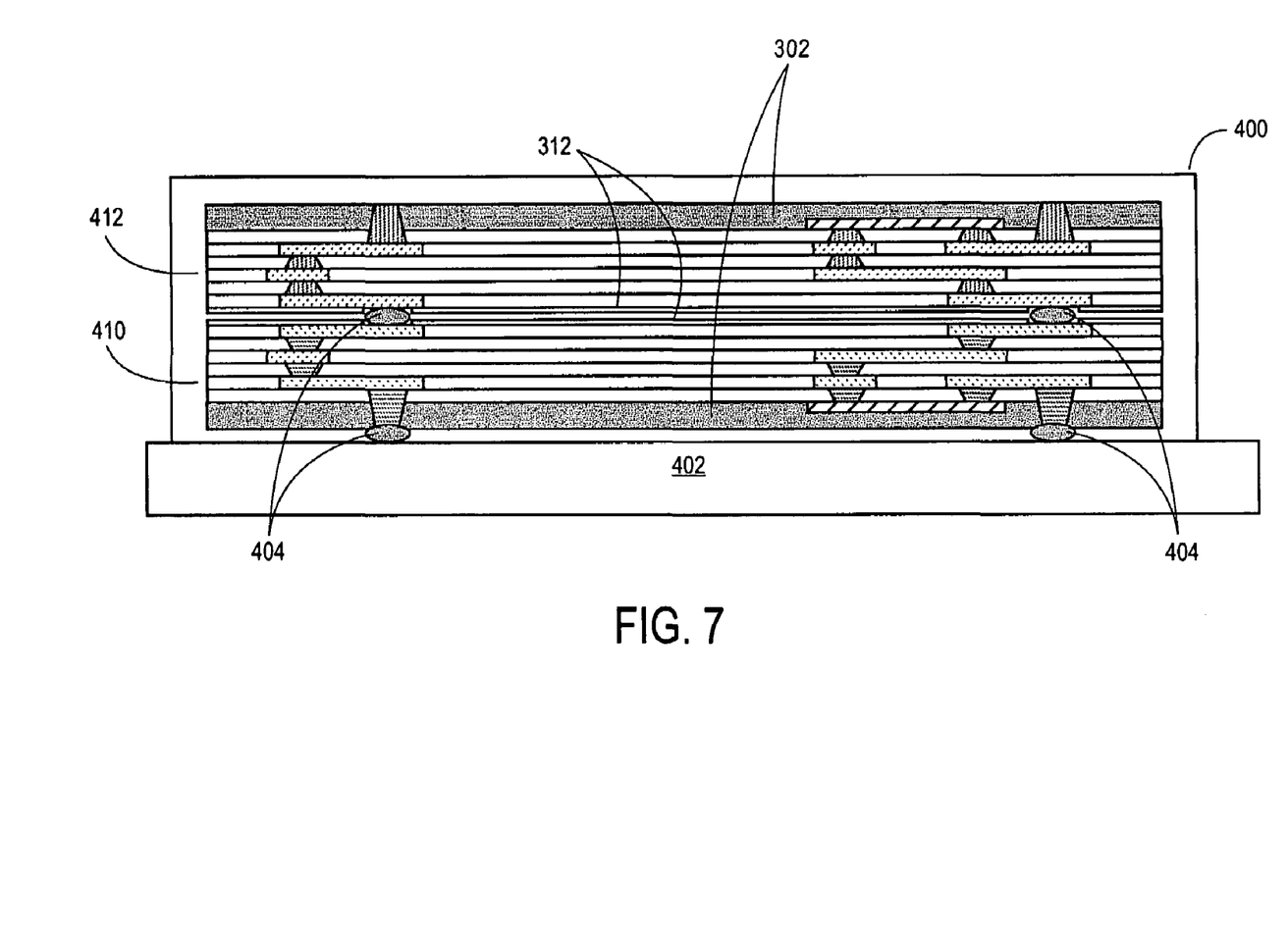
FIG. 7 is an illustration of a cross section of a package containing multiple stacked die according to one embodiment of the present invention, where the die are stacked in a top-top configuration.

FIG. 7 illustrates a top-top stacking configuration. In a top-top stacking configuration, the top passivation layers 312 (tops) of each die are adjacent to each other in the package 400 and are connected by interconnects 404. The substrate 302 (bottom) of the bottom die in the package is nearest to the package substrate 402 and is attached to the package substrate by interconnects 404.

Figure 8:
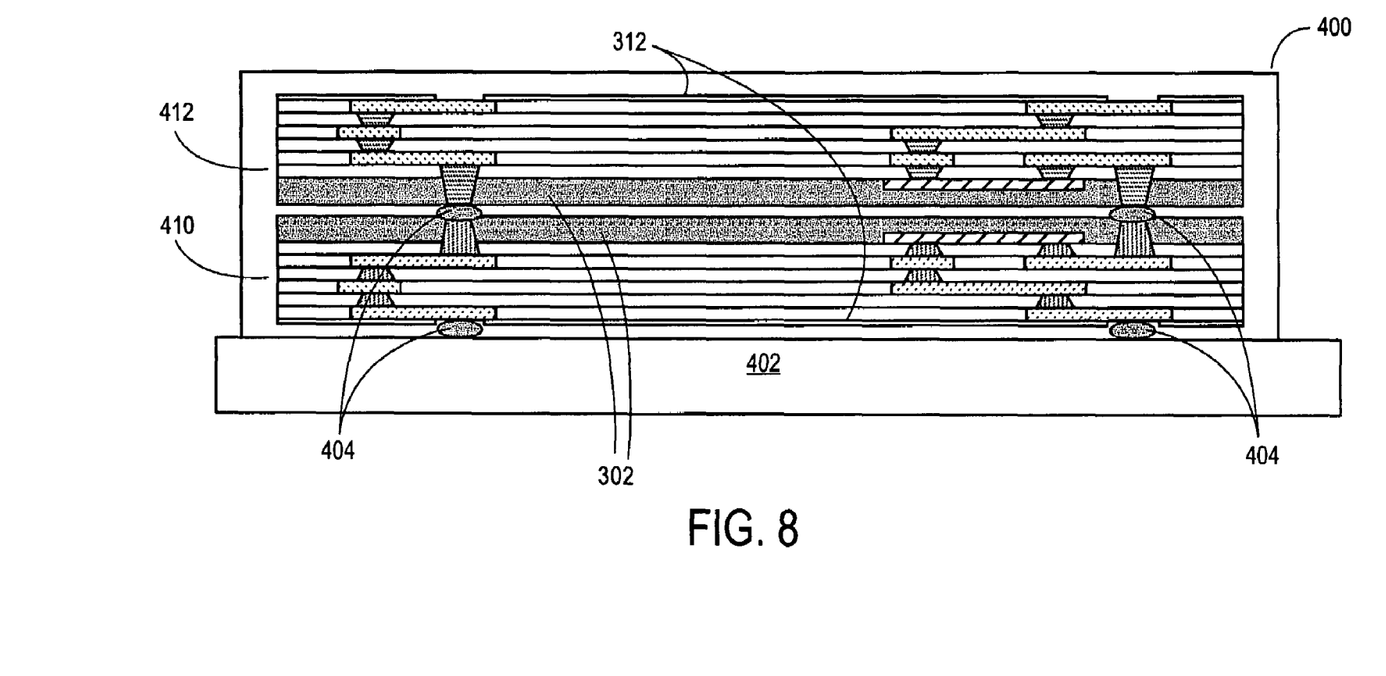
FIG. 8 is an illustration of a cross section of a package containing multiple stacked die according to one embodiment of the present invention, where the die are stacked in a bottom-bottom configuration.

FIG. 8 illustrates a bottom-bottom stacking configuration. In a bottom-bottom stacking configuration, the substrates 302 (bottoms) of each die are adjacent to each other in the package 400 and are connected by interconnects 404. The top passivation layer 312 (top) of the bottom die in the package is nearest to the package substrate 402 and is attached to the package substrate by interconnects 404.

In each of the die stacking configurations described above, the same method is used to generate a device ID for each die in the stack. An encoded device ID is passed to the die adjacent to the package substrate, and is the device ID for that die. The device ID is then operated on by a logic circuit in the lowest device in the die and the calculated device ID is passed through an interconnect to the adjacent die. Thus, the device ID for the any die in the stack is based on the device ID of the previous device in the stack.

Figure 9:
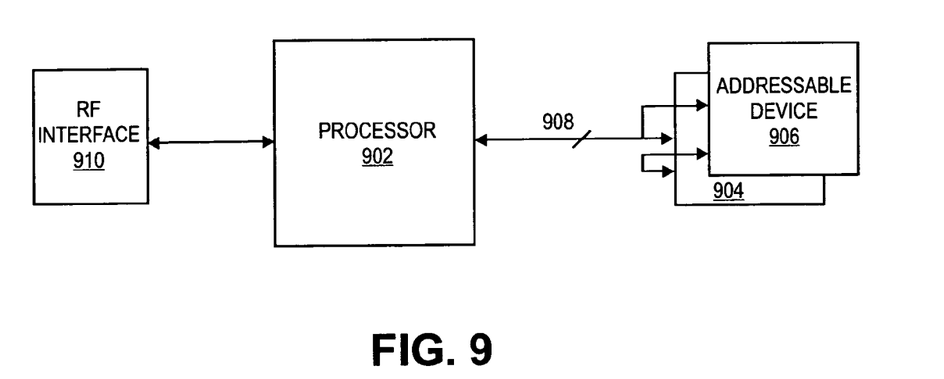
FIG. 9 is an illustration of a system configuration according to one embodiment of the present invention.

FIG. 9 illustrates an embodiment of a system implementation of the present invention. A processor 902 is coupled to addressable devices 904 and 906 by bus 908. In one embodiment of the present invention, bus 908 is an address or a data bus. Addressable devices 904 and 906 are stacked on top of each other, and are coupled to one another. Each addressable device contains at least one general signal pass-through to pass signals vertically through the die, as described above. Each addressable device contains a device ID pass-through circuit to generate a device ID, as described above. Device 904 has an encoded device ID.

The processor 902 is also coupled to an RF (radio frequency) interface 910. In one embodiment of the present invention, the system is incorporated into a wireless device. In another embodiment of the present invention, the system is incorporated into a handheld device.

I claim:

1. An apparatus comprising:
   a first addressable device associated with a first device identifier (ID);
   a second addressable device stacked adjacent to the first addressable device, wherein the second addressable device is coupled to the first addressable device and includes a circuit to generate a second device ID as a function of the first device ID.

2. The apparatus of claim 1, wherein the first addressable device is selected from the group including flash memory, SRAM, DRAM, SDRAM, EPROM, EEPROM, ROM, MEMS devices, MEMS memory, and memory plus logic devices.

3. The apparatus of claim 1, wherein the second addressable device is selected from the group including flash memory, SRAM, DRAM, SDRAM, EPROM, EEPROM, ROM, MEMS devices, MEMS memory, and memory plus logic devices.

4. The apparatus of claim 1, wherein the first device ID is encoded.

5. The apparatus of claim 1, wherein the circuit is a +N adder circuit.

6. The apparatus of claim 1, wherein the circuit is selected from the group including a −N adder circuit, a combinatorial logic circuit, an active logical shifter, and a passive logical shifter.

7. An apparatus comprising:
   a first addressable device having a first device ID;
   a second addressable device stacked on the first addressable device,
   wherein the second addressable device is coupled to the first addressable device and includes means for generating a second device ID as a function of the first device ID.

8. The apparatus of claim 7, wherein the first addressable device is selected from the group including flash memory, SRAM, DRAM, SDRAM, EPROM, EEPROM, ROM, MEMS devices, MEMS memory, and memory plus logic devices.

9. The apparatus of claim 7, wherein the second addressable device is selected from the group including flash memory, SRAM, DRAM, SDRAM, EPROM, EEPROM, ROM, MEMS devices, MEMS memory, and memory plus logic devices.

10. The apparatus of claim 7, wherein the first device ID is encoded.

11. An apparatus comprising:
    a first integrated circuit die and a second integrated circuit die in a stacked configuration, the first integrated circuit die including:
    a through-silicon via; and
    a device identification (ID) generating circuit, the device ID
    generating circuit to receive a first device ID and to provide a
    second, different device ID that is a function of the first device ID,
    the second device ID to identify the second integrated circuit die.

12. A method comprising:
    stacking a plurality of addressable devices in a package, the package having a package substrate;
    encoding a device ID for one addressable device in the stack; and
    determining the device ID for each of the plurality of addressable devices whose device ID is not encoded based upon the device ID of an adjacent device in the stack.

13. The method of claim 12, wherein the plurality of addressable devices are selected from the group including flash memory, SRAM, DRAM, SDRAM, EPROM, EEPROM, ROM, MEMS devices, MEMS memory, and memory plus logic devices.

14. The method of claim 12, wherein the device ID for one addressable device in the stack is encoded in the package substrate.

15. The method of claim 12, further comprising electrically coupling the package to a printed circuit board.

16. The method of claim 15, wherein the device ID for one addressable device in the stack is encoded in the printed circuit board.

17. The method of claim 12, further comprising bonding the plurality of stacked addressable devices to each other using through-silicon via technology.

18. The method of claim 12, further comprising coupling the plurality of stacked addressable devices to each other optically.

19. The method of claim 12, further comprising capacitively coupling the plurality of stacked addressable devices to each other.

20. The method of claim 12, wherein each of the plurality of addressable devices whose device ID is not encoded contains a +N adder circuit.

21. The method of claim 12, wherein each of the plurality of addressable devices whose device ID is not encoded contains a −N adder circuit.

22. The method of claim 12, wherein each of the plurality of addressable devices whose device ID is not encoded contains combinatorial logic to produce a desired output from a given input.

23. The method of claim 12, wherein each of the plurality of addressable devices whose device ID is not encoded contains an active logical shifter.

24. The method of claim 12, wherein each of the plurality of addressable devices whose device ID in the printed circuit board contains a passive logical shifter.

25. The method of claim 12, wherein the device ID determined for each of the plurality of addressable devices is unique to one of the plurality of addressable devices.

26. A method comprising:
stacking a plurality of addressable devices;
coupling each of the plurality of addressable devices to the device below it and the device above it;
encoding a device ID for one of the plurality of addressable devices; and
determining the device ID for each of the plurality of addressable devices whose device ID is not encoded based upon the device ID of an adjacent device in the stack.

27. The method of claim 26, wherein the plurality of addressable devices are selected from the group including flash memory, SRAM, DRAM, SDRAM, EPROM, EEPROM, ROM, MEMS devices, MEMS memory, and memory plus logic devices.

28. The method of claim 26, wherein the plurality of addressable devices are coupled electrically.

29. The method of claim 26, wherein the plurality of addressable devices are coupled optically.

30. The method of claim 26, wherein the plurality of addressable devices are coupled capacitively.

31. The method of claim 26, wherein each of the plurality of addressable devices whose device ID is not encoded contains a +N adder circuit.

32. The method of claim 26, wherein the device ID determined for each of the plurality of addressable devices is unique to one of the plurality of addressable devices.

33. The method of claim 26, further comprising coupling one of the plurality of addressable devices to a printed circuit board.

34. The method of claim 33, wherein the device ID for one addressable device in the stack is encoded in the printed circuit board.

35. The method of claim 26, wherein the device ID for one addressable device in the stack is electrically encoded in non-volatile memory within the one addressable device.

36. The method of claim 26, wherein the device ID for one addressable device in the stack is electrically encoded in fuses within the one addressable device.

37. The method of claim 26, wherein the device ID for one addressable device in the stack is hard-wired within the one addressable device using a metal option.

38. A system comprising:
a bus;
a processor coupled to the bus;
a first addressable device coupled to the bus and having a first device ID;
a second addressable device stacked on the first addressable device,
wherein the second addressable device is coupled to the bus and coupled to the first addressable device, and includes a circuit to generate a second device ID as a function of the first device ID; and
an RE interface coupled to the processor.

39. The system of claim 38, wherein the first addressable device is selected from the group including flash memory, SRAM, DRAM, SDRAM, EPROM, EEPROM, ROM, MEMS devices, MEMS memory, and memory plus logic devices.

40. The system of claim 38, wherein the second addressable device is selected from the group including flash memory, SRAM, DRAM, SDRAM, EPROM, EEPROM, ROM, MEMS devices, MEMS memory, and memory plus logic devices.

41. The system of claim 38, wherein the first device ID is encoded.

42. The system of claim 38, wherein the circuit is a +N adder circuit.

43. The system of claim 38, wherein the circuit is selected from the group including a −N adder circuit, a combinatorial logic circuit, an active logical shifter, and a passive logical shifter.

* * * * *